United States Patent
Thomas

(10) Patent No.: US 6,242,354 B1
(45) Date of Patent: *Jun. 5, 2001

(54) SEMICONDUCTOR DEVICE WITH SELF ALIGNED CONTACTS HAVING INTEGRATED SILICIDE STRINGER REMOVAL AND METHOD THEREOF

(75) Inventor: Michael E. Thomas, Milpitas, CA (US)

(73) Assignee: National Semiconductor Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/023,027

(22) Filed: Feb. 12, 1998

(51) Int. Cl.⁷ ................................................. H01L 21/302
(52) U.S. Cl. ............................ 438/696; 438/721; 438/744
(58) Field of Search ................................. 438/234, 303, 438/258, 305, 623, 694, 728, 655, 682, 696, 721, 744; 257/384, 308

(56) References Cited

U.S. PATENT DOCUMENTS

| | | |
|---|---|---|
| 4,722,909 * | 2/1988 | Parrillo et al. ........................ 438/231 |
| 5,006,911 | 4/1991 | Sivan ..................................... 257/328 |
| 5,102,816 | 4/1992 | Manukonda et al. . |
| 5,352,631 | 10/1994 | Sitaram et al. . |
| 5,464,782 | 11/1995 | Koh . |
| 5,640,023 | 6/1997 | Balasinski et al. . |
| 5,766,991 * | 6/1998 | Chen ..................................... 438/231 |
| 5,830,775 * | 11/1998 | Maa et al. ....................... 148/DIG. 19 |
| 5,841,173 * | 11/1998 | Yamashita .............................. 257/384 |
| 5,962,347 * | 10/1999 | Tokunaga et al. ..................... 438/728 |
| 6,004,878 * | 12/1999 | Thomas et al. ....................... 438/655 |

* cited by examiner

Primary Examiner—Olik Chaudhuri
Assistant Examiner—William David Coleman
(74) Attorney, Agent, or Firm—Skjerven Morrill MacPherson LLP; Edward CX. Kwok

(57) ABSTRACT

Sidewall spacers, adjacent a gate electrode and source/drain regions of a MOS transistor are formed of a dielectric material that can be completely or partially removed to "lift-off" silicide stringers if formed. After silicide stringer removal, a dielectric layer, having a first portion and second portion that are selectively etchable with respect to one another, is deposited. A gate contact opening is formed in the dielectric layer where the opening is essentially the same dimension as the gate length. Alignment of the opening to the gate electrode is buffered by the thickness of the first portion of the dielectric layer, adjacent sidewalls of the gate electrode.

12 Claims, 4 Drawing Sheets

SEMICONDUCTOR DEVICE WITH SELF ALIGNED CONTACTS HAVING INTEGRATED SILICIDE STRINGER REMOVAL AND METHOD THEREOF

RELATED APPLICATION

A related application entitled "A METHOD FOR SILICIDE STRINGER REMOVAL IN THE FABRICATION OF SEMICONDUCTOR INTEGRATED CIRCUITS", by the inventors of the present application, is filed concurrently herewith, U.S. Ser. No. 09/022,597 filed Feb. 12, 1998 now U.S. Pat. No. 6,004,878.

BACKGROUND

1. Field of the Invention

This invention relates to a Metal Oxide Semiconductor (MOS) integrated circuit and method of fabrication thereof, and more specifically to a MOS transistor structure with self-aligned contacts and a method for the fabrication of thereof with integrated silicide stringer removal.

2. Related Art

Self-ALigned metal silICIDE contact structures, commonly referred to as salicide structures, are often used in the formation of Metal Oxide Semiconductor (MOS) transistor structures to minimize contact resistance. Thus, allowing for reduction of the size of contact structures. While the formation of these salicide structures require several process steps, advantageously, none is a masking step; hence, processes for the formation of salicide structures are widely used.

In one known salicide process for a MOS transistor, source and drain (S/D) regions are formed aligned to a gate electrode structure and/or any sidewall spacers that may be used. A blanket metal layer is deposited so that silicon, at the upper surface of source, drain and gate regions, is in contact with the metal. The wafer is then heated to a temperature sufficiently high for the metal and silicon, in contact with one another, to undergo a reaction and form a metal silicide. The unreacted metal is then removed, and regions of metal silicide are revealed. Thus, by employing a salicide process, regions of metal silicide are formed aligned, without benefit of a masking step, in this example as S/D and gate regions. These silicide regions, formed without masking steps, are referred to as self-aligned regions. During the salicide process the sidewall spacers serve to provide sufficient spacing to prevent bridging of the gate silicide region with either the source or drain silicide regions. Often, one or more optimizations or process modifications are used to help prevent metal bridging, commonly referred to as stringers. After removal of the unreacted metal, a second, higher temperature silicide anneal step is often employed to stabilize the silicide regions formed and to provide the lowest possible silicide resistivity.

However, further reductions in device geometries, for example to meet the demand for higher performance, necessarily reduces the size of the sidewall spacers. These smaller sidewall spacers are then less able to provide adequate spacing between adjacent regions during silicide formation and increased metal bridging or stringers result. While stringer formation occurs due to a variety of reasons, reduced spacer size results in the various optimizations or process modifications used to alleviate the problem being less successful. Thus the yield loss due to electrical shorts caused by such stringers increases.

While the reduced device geometries often result in a lower device yield, as discussed above, the full benefit of the geometry reductions is typically not realized. Referring to FIG. 1A, a plan view of a portion of a transistor formed in a semiconductor substrate, in the manner of the prior art, is shown. Prior art transistor 200 has a gate structure 300 having a gate electrode region 304. Gate electrode region 304 crosses over an active area 260 having source and drain (S/D) regions 240 formed therein. Gate region 304 and S/D regions 240 define a channel region 400, (indicated with dashed lines). Where maximum performance is desired for transistor 200, region 304 is formed having a gate length 310 that is the minimum dimension achievable within the process technology employed. In this manner, device performance is enhanced, as compared to transistors having larger gate lengths 310. However, where a prior art transistor 200 has a minimum dimension gate length 310, gate electrode region 304 does not provide sufficient space for electrical contact and an additional gate contact region 302 is needed.

Gate contact region 302 has a contact hole 220. Contact hole 220 is formed in a dielectric layer (not shown) that overlies the substrate (not shown) and all of transistor 200. Contact hole 220 has edges 225 that are spaced a distance 204 from edges 305 of gate contact region 302 to form a buffering region 230 about hole 220. This additional space or buffering region 230 serves to provide an area that accommodates normal photolithographic and etch process variations in positioning and forming contact hole 220, while ensuring that hole 220 always falls within region 302. Thus, rather than a direct contact to region 304, electrical contact to region 304 is made in an indirect manner, through region 302 and prior art transistors 200 can not achieve a minimum total surface area.

Turning to FIG. 1B, a transistor 500 having direct gate contact is shown being formed with the prior art process. Process buffering regions 530 are provided to allow positioning of a gate contact hole 520 within the boundaries of a gate electrode region 504. As a result, gate length 610 is necessarily larger that minimum gate length 310 (FIG. 1A) of prior art transistor 200 (FIG. 1A), as it includes buffering regions 530. Thus,while transistor 500 may use less area than transistor 200, larger gate length 610 will result in reduced performance for transistor 500 ans compared to transistor 200. Therefore, transistors formed in the manner of the prior art can not simultaneously achieve both maximum transistor performance and minimum surface area.

Thus, it would be advantageous to form an MOS transistor having self-aligned silicide enhanced contact regions that are free of silicide stringers and have direct electrical coupling to selected silicide regions within the boundaries of the device. In addition, it would be advantageous to have a method for forming such an MOS transistor without adding any masking steps to those for a standard MOS transistor fabrication method. Finally, it would be advantageous for the transistor and method for forming, thereof, to allow a choice of transistor isolation processes, for example a local oxidation of silicon (LOCOS) process or a trench isolation process.

SUMMARY

In accordance with the present invention, an MOS transistor having self-aligned silicide enhanced contact regions that are free of silicide stringers and having electrical coupling to selected silicide regions within the device boundaries, and method of fabrication thereof, are enabled. A gate electrode structure is provided overlying a semiconductor substrate. In some embodiments, the gate electrode structure is a minimum device geometry. Sidewall spacers are formed adjacent to the gate electrode and provide spacing between the subsequently formed S/D regions and the areas under the gate electrode structure. A source and a drain region are formed within the substrate, these S/D regions aligned to the gate electrode structure. In some embodiments a metal layer is formed overlying exposed areas of the gate electrode and S/D regions and the substrate is heated to a temperature sufficiently high for the metal layer to react and form silicide regions in the exposed areas. In some embodiments of the present invention, metal gate electrodes are employed and no silicide region overlying the gate electrode is formed.

After formation of the silicide regions, at least some portion of the sidewall spacers are removed selectively with respect to any like material in isolation or other regions. Thus removing or "lifting-off" silicide stringers that may have formed.

After stringer removal, a conformal etch-stop layer is deposited overlying the substrate and including the gate electrode structure, followed by deposition of a dielectric layer. The conformal layer is selected such that it etches selectively with respect to the dielectric layer and isolation regions. In some embodiments the dielectric layer is planarized, a masking layer formed thereon and patterned, and the dielectric layer etched to form contact holes which expose underlying portions of the etch-stop layer. In other embodiments the dielectric layer is patterned and etched without planarization. The etch-stop layer is then etched to expose portions of the silicided regions. The etch selectivity of the etch-stop layer with respect to the isolation regions advantageously allows the contact holes formed in the dielectric layer to overlie portions of the isolation regions. In addition, the conformal nature of the etch-stop layer beneficially serves to provide buffering regions for the process tolerances required to form the contact holes. These process buffering regions do not increase the effective dimensions of the gate structure. Thus, direct electrical coupling to selected silicide or other contact regions can be accomplished without an increase in the size of the underlying structure. For example, a contact opening for direct electrical coupling to a gate electrode can have the same dimension as the gate width. Thus, embodiments in accordance with the present invention take advantage of the size reduction in device geometries.

BRIEF DESCRIPTION OF THE DRAWINGS

The present invention may be better understood, and its numerous objects, features, and advantages made apparent to those skilled in the art by referencing the accompanying drawings. For ease of understanding and simplicity, where elements are common between illustrations, common numbering of those elements is employed between illustrations.

DETAILED DESCRIPTION

As embodiments of the present invention are described with reference to the drawings, various modifications or adaptations of the specific methods and or structures may become apparent to those skilled in the art. All such modifications, adaptations or variations that rely upon the teachings of the present invention, and through which these teachings have advanced the art, are considered to be within the spirit and scope of the present invention. For example, in some embodiments of the present invention silicide stringers are removed after a high temperature silicide forming and anneal step. In other embodiments silicide stringers are removed in-between a low temperature silicide forming step and a high temperature silicide anneal step.

In a related application, "A METHOD FOR SILICIDE STRINGER REMOVAL IN THE FABRICATION OF SEMICONDUCTOR INTEGRATED CIRCUITS", by the inventors of the present application, Attorney Docket No. NS-3678, filed concurrently herewith, a method for silicide stringer removal is presented. The aforementioned application is included herein by reference.

Figure 2:
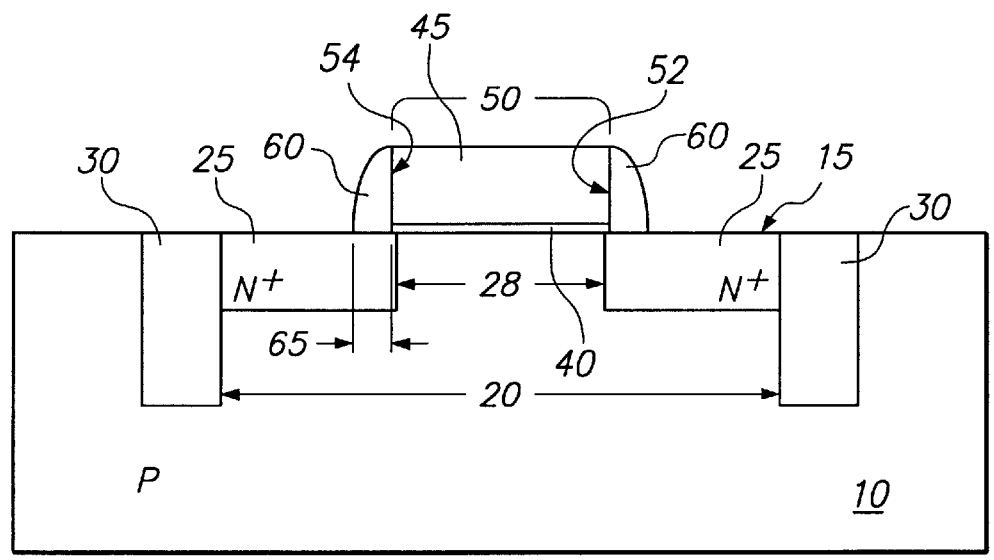
FIGS. 2–7 are cross-sectional representations of stages in the formation of a MOS transistor having self-aligned contacts and incorporating a silicide stringer removal process in accordance with an embodiment of the present invention.

FIG. 2 is a simplified cross-sectional view of an intermediate stage in the fabrication of a MOS transistor in the manner of the present invention. A semiconductor wafer 10 is shown having shallow trench isolation regions 30. While wafer 10 is depicted as having a minimum of complexity, other types of substrates may be advantageously employed. For example, substrate 10 can be an N-type or P-type substrate, or can be an N-type or P-type substrate encompassing N and/or P-type well regions (not shown) and/or an epitaxial layer (not shown). Alternatively, substrate 10 can encompass a silicon on insulator (SOI) structure, or other appropriate semiconductor substrate material or structure. In addition, while FIG. 2 depicts isolation regions 30 as shallow trench isolation regions 30, other appropriate methods of isolation can be also employed. For example, regions 30 can be formed using any of the LOCOS or LOCalized Oxidation of Silicon isolation methods.

A gate dielectric layer 40 is formed on upper surface 15, overlying an active area 20 defined by upper surface 15 and isolation regions 30. Gate dielectric layer 40 is typically a silicon oxide layer formed in the range of approximately 3 to 8 nanometers (nm), although other appropriate thicknesses or materials can be used. For example, gate layer 40 can be formed as a composite layer of chemical vapor deposited (CVD) oxide and thermal oxide, or of a nitrided oxide material, as known. In addition, gate layer 40 can be formed as a composite layer of silicon oxide and silicon nitride, or formed of one of the high dielectric materials such as tantalum pentoxide ($Ta_2O_5$) or combinations thereof.

A gate electrode layer 45 is formed overlying gate layer 40. Gate electrode layer 45 is typically a polysilicon material having a thickness of between approximately 200 to 350 nm, although amorphous silicon, a combination of amorphous silicon and polysilicon or any other appropriate material can be used to form gate electrode layer 45. In addition, in some embodiments in accordance with the present invention, it is advantageous to employ a metal gate electrode layer 45, such as tungsten (W), molybdenum (Mo) or tantalum (Ta). For example, in some embodiments a W gate electrode 45 can be advantageously used with a $Ta_2O_5$ gate dielectric layer 40. Alternatively, in some embodiments it is advantageous to employ a Mo or Ta gate electrode 45 overlying a silicon oxide gate dielectic layer 40 having an intervening barrier layer such as titainium/titainium nitride (not shown).

Where gate electrode layer 45 encompass a silicon material, such layers are typically deposited as a doped layer (in-situ doping) and/or doped concurrently with the doping of other regions, for example source and drain regions 25. Typically, such layers 45 are deposited having a thickness between approximately 200 to 400 nm. Where gate electrode layer 45 is a metal layer, such layers are typically deposited using physical vapor or chemical vapor deposition methods having a thickness between approximately 80 to 200 nm. Once formed, layers 40 and 45 are patterned, using well known photolithography and etch techniques to form a gate structure 50 overlying a portion of active area 20, as depicted.

FIG. 2 shows source and drain (S/D) regions 25, having a minimum of complexity, formed adjacent to opposite sides 52 and 54 of gate structure 50 in active area 20 and defining a channel region 28 underlying gate structure 50. Formation of S/D regions 25 can be accomplished using any of the variety of methods that have been developed to form S/D regions 25 and that are tailored for specific performance requirements. As known, there are many such methods for forming S/D regions 25 having various levels of complexity. Thus, in some embodiments of the present invention, a method to form lightly doped drain (LDD) S/D regions 25 can be employed, while in other embodiments, other appropriate methods for forming S/D regions 25 can be used. Notwithstanding the method used to form S/D regions 25, where semiconductor wafer 10 is a P-type substrate, or active area 20 encompasses a P-type well structure (not shown), S/D regions 25 are doped N-type, as depicted. Alternatively, where wafer 10 is N-type or area 20 encompasses an N-type well region (not shown), S/D regions 25 are P-type (not shown).

In some embodiments of the present invention, sidewall spacers 60 are employed during formation of S/D regions 25. In some embodiments, a dielectric material is deposited as a blanket dielectric layer (not shown) and anisotropically etched to form spacers 60. The anisotropic etch process selected is selective to both the material of isolation regions 30 and substrate 10. Typically, the dielectric material selected is a CVD or PECVD (Plasma Enhanced CVD) silicon oxide material. In some embodiments, materials other than silicon oxide and/or a combination of materials is employed. Thus, spacers 60 can be formed using silicon oxide, silicon nitride, or a combination of oxide and nitride, as will be discussed hereinafter, and typically overlie portions of each S/D region 25, as depicted.

Width 65 of spacers 60 is controlled, in significant part, by the thickness of the layer of dielectric material deposited. Typically width 65 is between approximately 80 to 100 nm, although other appropriate widths, thicker or thinner, can be used. Hence, the dielectric layer is deposited having a thickness at least equal to desired width 65. Where sidewall spacers 60 are used in conjunction with the formation of S/D regions 25, for example S/D regions 25 employing an LDD process, the specific order of processing depends from the specific S/D method selected, as known. In some embodiments of the present invention, where spacers 60 are not used to form S/D regions 25, they are, however, appropriately formed to provide adequate spacing for silicide formation as will be discussed hereinafter.

Figure 3:
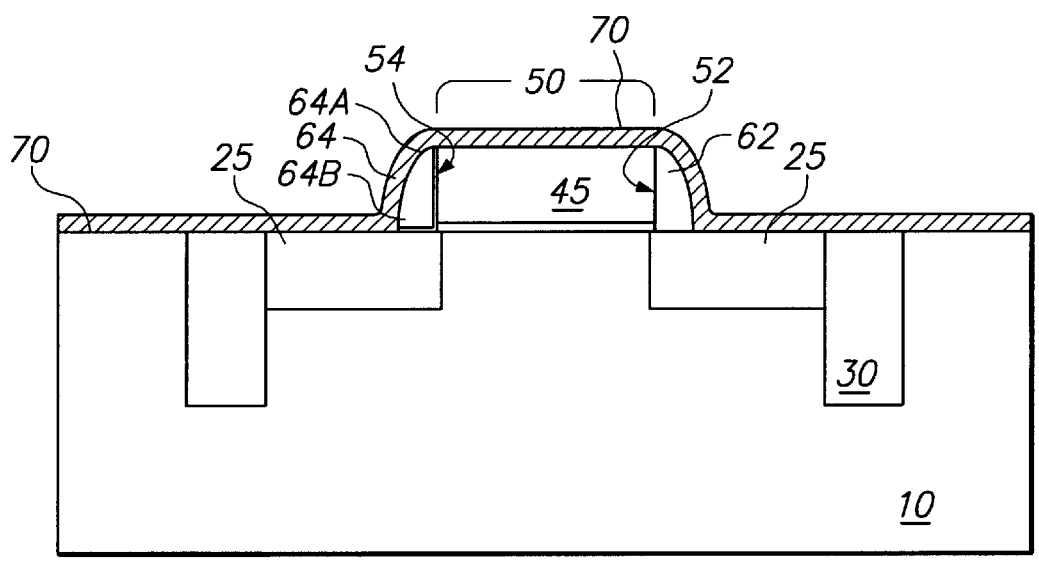

Referring now to FIG. 3, two embodiments of spacers 60, depicted in FIG. 2, are illustrated. A first alternate spacer 62 and second alternate spacer 64 are shown adjacent sidewalls 52 and 54, respectively, of gate structure 50. As previously discussed, spacers 60 (FIG. 2) can be formed of a single material or combination of materials. Thus, as depicted, first spacer 62 is formed with an essentially uniform body and is representative of a silicon oxide or silicon nitride spacer formed from a uniform oxide or nitride layer. On the other hand, second spacer 64 has a first portion 64A and a second portion 64B and is representative of a spacer formed from a layer that is a combination of dielectric materials, e.g. silicon oxide and silicon nitride, respectively. Thus some embodiments of the present invention are practiced using first spacer 62 and other embodiments using second spacer 64.

First portion 64A is preferably a thin oxide material formed as a layer (not shown) approximately 10 to 30 nm thick overlying substrate 10 and gate structure 50. Where gate electrode layer 45 is formed of a metal material, first portion 64A is preferably formed by a chemical vapor deposition (CVD) process. Where gate electrode layer 45 is formed of a silicon material, first portion 64A is preferably formed by a thermal oxidation process, although a CVD process is also appropriate. Where first portion 64A is an oxide material, second portion 64B is preferably a silicon nitride material initially formed by a CVD or PECVD process as a layer (not shown), approximately 50 to 80 nm thick, overlying the silicon oxide layer (not shown); where the total thickness of the combined layer is between approximately 80 to 100 nm. In some embodiments, this combination layer of silicon oxide and silicon nitride, is subsequently anisotropically etched using a first etch process to etch the silicon nitride and a second process to etch the silicon oxide, preferably as a single sequential etch process to form second spacer 64. In some embodiments a single etch process is employed, where the etch process selected has limited selectivity between silicon oxide and silicon nitride.

FIG. 3 also depicts a blanket layer of metal 70 deposited subsequent to the formation of spacers 62 or 64 and overlying exposed regions of S/D regions 25 and gate structure 50. Metal layer 70 is selected to be a material capable of forming a metal silicide if heated above a threshold temperature when in contact with silicon (Si). For example, cobalt (Co) reacts to form cobalt silicide (CoSi$_2$). Other metals that form silicides include tungsten (W), tantalum (Ta), hafnium (Hf), molybdenum (Mo), neodymium (Nd) and zirconium (Zr), as well as titanium (Ti), and several of the Group VIII metals such as platinum (Pt), palladium (Pd) and nickel (Ni). While any of the silicide forming metals can be used to form metal layer 70, typically either Co or Ti is employed, as the silicides they form, and the silicide formed from Ni, have the lowest resistivities. Thus, while embodiments of the present invention can encompass any silicide forming metal, it has been found advantageous to form metal silicides using either Co or Ti. Hence, in some embodiments a layer of Co, for example, is sputter deposited to a thickness of approximately 25 to 60 nm to form metal layer 70, while in other embodiments a layer of Ti or other silicide forming metal is similarly deposited. It will be noted, that where gate electrode layer 45 is a metal material, typically a metal is selected for layer 70 that can be selectively etched with respect to the material of layer 45, as will be described hereinafter.

Figure 4:
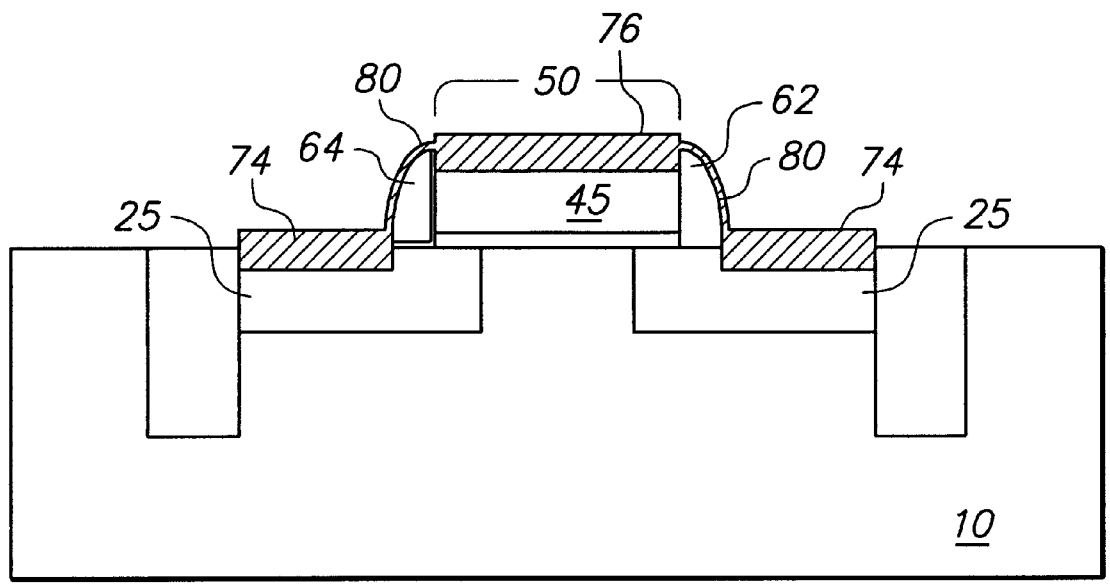

FIG. 4 illustrates the structure of FIG. 3 having a gate electrode layer 45 formed of a silicon material after a heating or silicide formation step and removal of unreacted metal. A S/D silicide region 74 is formed in each S/D region 25, and a gate silicide region 76 is formed in gate structure 50. As known, each silicide region (74, 76) is formed by the reaction of exposed silicon regions, such as upper portions of regions 25 and 50, with the metal of layer 70 (FIG. 3). The thickness of the silicide regions (74, 76) formed is dependent upon the specific metal used for metal layer 70, its thickness, the doping of the underlying silicon region and the temperature and time at that temperature employed in the silicide forming step. Thus, for a metal layer 70 (FIG. 3) having a thickness between approximately 25 to 60 nm and heated to a temperature between approximately 400 to 750 degrees Centigrade (° C.) for between 30 and 120 seconds in a rapid thermal processor, a thickness of approximately 10 to 60 nm for silicide regions 74 and 76 is typical. Where gate electrode layer 45 is a metal material, silicide region 76 is not formed.

During the forming step of silicide regions 74 and 76 in embodiments encompassing a gate electrode layer 45 formed of a silicon material, not all of metal layer 70 (FIG. 3) overlying regions of exposed silicon is necessarily converted to metal silicide. Also, where gate electrode layer 45 encompasses a metal material, portions of metal layer 70 overlying gate structure 50 are not converted to a metal silicide. Typically, this unreacted metal, if any, is removed. To accomplish this removal, an etch process that selectively removes unreacted metal in the presence of metal silicide is used. For example, in embodiments where gate electrode 45 encompasses a silicon material and metal layer 70 is Co, one such mixture is referred to as PAN etch (Phosphoric, Acetic and Nitric acids) and used to remove unreacted Co in the presence of $CoSi_2$. In embodiments where gate electrode material 45 encompasses a metal material, for example W, and metal layer 70 (FIG. 3) is Co, PAN etch can be used to remove unreacted Co in the presence of $CoSi_2$ and W. In some embodiments of the present invention, once unreacted metal is removed, substrate 10 is heated to a second temperature, typically higher than the first temperature, to complete the formation of any metal silicide regions 74 and 76 present. In some embodiments, heating substrate 10 to the second temperature is performed at a subsequent step, as will be discussed. In some embodiments, only a single heating step is employed.

Additionally, FIG. 4 depicts stringers 80 overlying spacers 62 and 64. It will be understood that while stringers 80 are depicted overlying both spacers 62 and 64, this is for illustrative purposes only. The undesirable formation of stringers 80 can result in electrical coupling of region 74 to region 76, or where a metal gate electrode 45 is used, directly to electrode 45. Stringers 80 can be formed due to a variety of factors. For example, where spacer 62 is silicon oxide, silicon from substrate 10 and/or gate structure 50 can migrate to and over the surface of spacer 62. This surface silicon can then react to form metal silicide as stringer 80. Shrinking device geometries that results in smaller spacers 62, i.e. reduced width 65 (FIG. 2), make such Si migration easier and stringer formation a more serious problem.

As the thickness typically employed for a metal gate layer 45, as compared to a silicon gate electrode layer 45, is much reduced, the formation of stringers 80 can still be a serious problem, despite the lack of Si migration from such a metal layer 45. To reduce such stringer formation, alternative processes or process modifications have been developed. For example, the temperature of the initial silicide forming step is reduced or the time at the elevated temperature is shortened. However, it has been found that while such alterations and/or modifications of the silicide forming process can alleviate stringer formation, they cannot reliably eliminate it. Stringers 80 can also form due to non-uniformities in processing. Thus, variations in the thickness of metal layer 70, the temperature during silicide formation or the uniformity of the selective etch used to remove any unreacted metal also result in the formation of stringers 80. Hence, it can be seen that a method to completely remove stringers 80 would be desirable.

Figure 5:
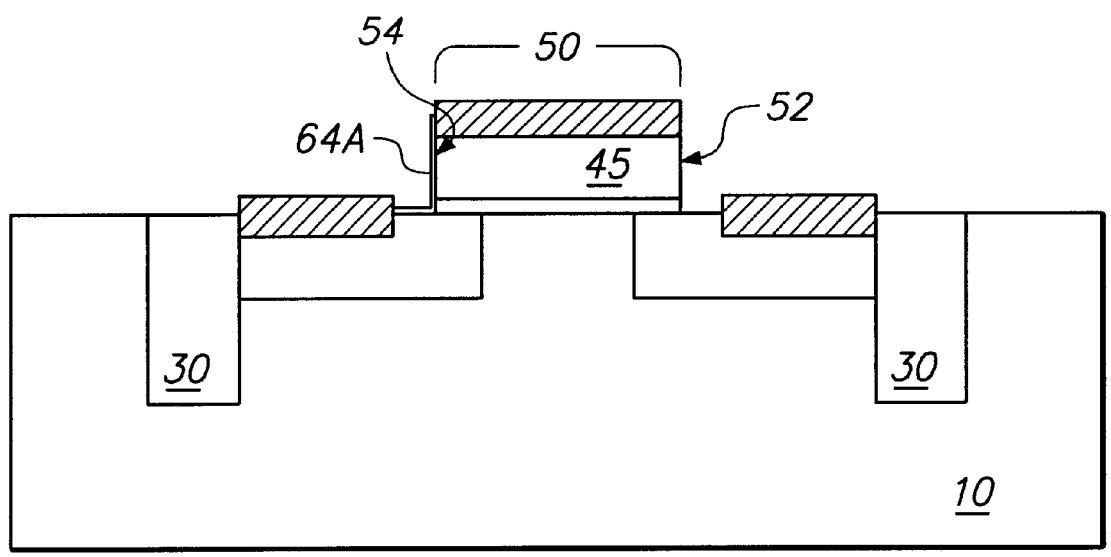

Turning now to FIG. 5, the structure of FIG. 4 is shown illustrating the result of stringer removal steps in accordance with embodiments of the present invention. Adjacent sidewall 52 of gate structure 50, spacer 62 (see FIG. 4) has been removed in accordance with some embodiments of the present invention. In so doing, stringer 80 (FIG. 4) is also removed. In some embodiments employing uniform spacer 62, stringers 80 can also be removed by etching only a portion spacer 62. Thus, stringers 80 are "lifted-off" by removing only some material from spacers 62, the un-etched portion (not shown) of each spacer 62 remaining adjacent to its respective sidewall 52. For embodiments of the present invention that employ spacers 64 (FIG. 4), stringers 80 can be eliminated by removal of second portion 64B (FIG. 3). Thus, adjacent sidewall 54, stringer 80 has been removed or "lifted-off" by the removal of portion 64B. Where only portion 64B is removed, portion 64A advantageously remains to protect the sidewalls of gate structure 50, as indicated.

There are a variety of methods for removing spacers 62 and 64 (FIG. 4) in accordance with embodiments of the present invention. For example, where spacers 62 are formed of a phosphorus doped silicon oxide, a dilute aqueous hydrogen fluoride (HF) solution rapidly etches-away all or part of spacers 62. While such a dilute HF solution will also remove silicon oxide from isolation regions 30, the amount of silicon oxide removed from regions 30 is minimized as the phosphorus doped spacer material etches significantly faster than the isolation oxide, as much as thirty times faster or more. Embodiments employing spacers 64 having a silicon nitride portion 64B (FIG. 3), on the other hand, are often etched using phosphoric acid. As one of ordinary skill will know, phosphoric acid will remove silicon nitride portion 64B with essentially no etching of silicon oxide. In this manner, not only is removal of isolation oxide from regions 30 essentially eliminated, but region 64A left in place, as depicted. Thus, the etch solution used and the material selected for spacers 62 and 64 (FIG. 3) provide selectivity between spacer material and isolation oxides.

Figure 6:
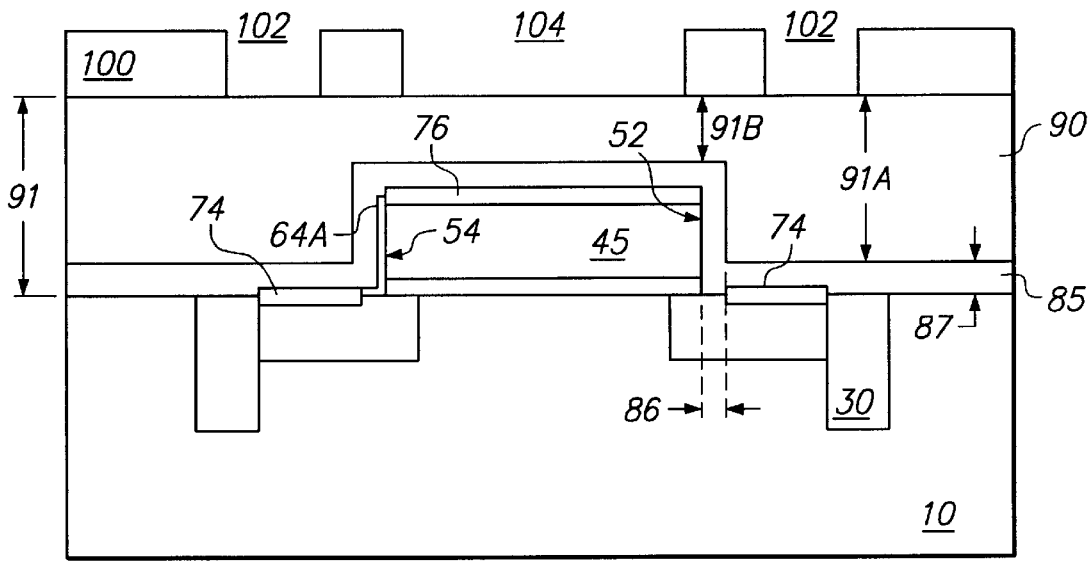

Turning now to FIG. 6, the structure of FIG. 5 is shown once stringer removal is complete and a conformal etch-stop layer 85 and a dielectric layer 90 are formed overlying substrate 10. For illustrative purposes, spacer portion 64A is depicted in place adjacent sidewall 54, while sidewall 52 is shown where spacer 62 (FIG. 4) has been removed. The choice of materials for etch-stop layer 85 and dielectric layer 90 can encompass a number of different materials and/or combinations of materials. However, as layer 85 serves, among other things, as an etch-stop for the etching of layer 90, the material of layer 85 is selected to be selectively etchable to the material of layer 90. In addition, as will be discussed, the material of layer 85 is selected to be selectively etchable to the materials of isolation regions 30 and underlying contact regions, for example silicide regions 74 and 76 where gate structure 50 encompasses a silicon gate layer 45. Thus, where layer 90 is a silicon oxide material, it has been found advantageous to select a silicon nitride material for layer 85. However, other appropriate materials and combinations of materials for layers 85 and 90 can also be selected.

In some embodiments, etch-stop layer 85 is formed in a manner similar to that described for the formation of spacers 64 (FIG. 4). For example, layer 85 can be formed from a thin silicon oxide first portion (not shown) and a thicker silicon nitride second portion (not shown). Such a dual layer etch-stop 85 is advantageously employed where transistor performance might deteriorate due to direct contact of gate structure 50 with silicon nitride. In other embodiments where gate electrode 45 requires protection from such direct contact with a silicon nitride material, for example where a gate electrode layer 45 encompassing a silicon material is employed, typically spacers 64 are advantageously used. After removal of any stringer 80 (FIG. 4) by etching away second portion 64B (FIG. 3), first portion 64A is advantageously left in place adjacent the sidewalls of the gate electrode 45, as shown. In this manner, gate electrode 45 is isolated from silicon nitride layer 85 by portion 64A, much the same way as where a dual material layer 85 (not shown), as described above, is employed. Thus, where spacers 64 (FIG. 4) are used and portion 64A left in place, the deposition of a single layer nitride film can be employed for gate electrode 45 that require protection from direct contact with a silicon nitride material.

Figure 7:
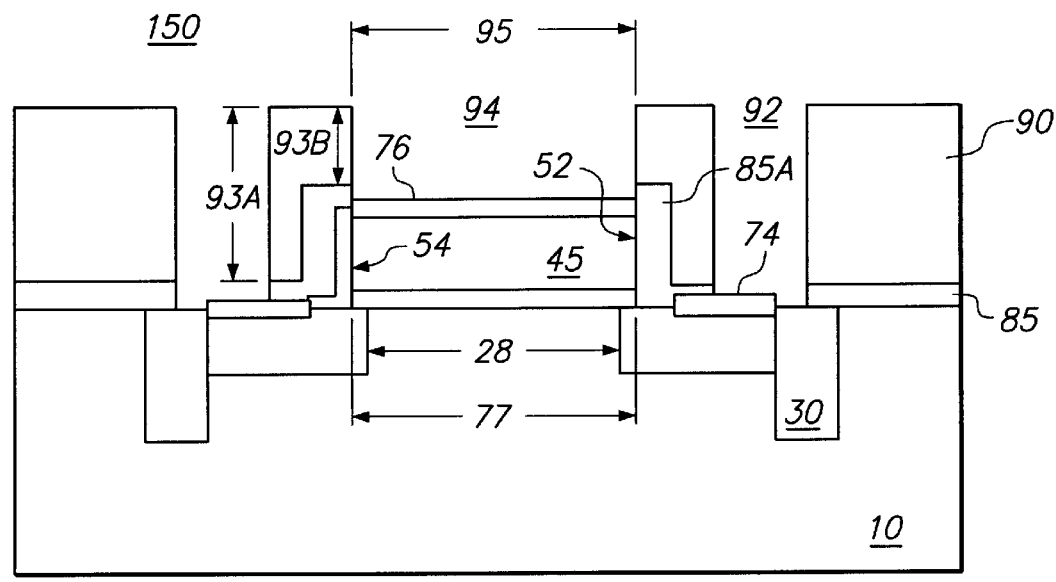

Etch-stop layer 85 also serves to provide a region for buffering process variation in the formation of a contact hole 94 (FIG. 7). The amount of process buffering etch-stop layer 85 provides is determined by width 86 of layer 85, adjacent sidewalls 52 and 54 of gate electrode 45. As known, conformal deposition techniques result in films, or layers, where the deposited thickness will essentially equal the width of the film adjacent any vertical features. Thus, width 86 is readily controlled by forming layer 85, using a conformal deposition technique such as PECVD silicon nitride, to have a specific thickness 87. Therefore, where formation of contact hole 94 (FIG. 7) requires 100 nm of process buffering, layer 85 is deposited where thickness 87 is at least 100 nm. For embodiments of the present invention where more or less process buffering is required, thicker or thinner depositions of layer 85 are employed.

Typically, embodiments of the present invention employ a planarization process, e.g. chemical mechanical polishing (CMP), to planarize layer 90. Thus, while an essentially uniform thickness of layer 90 is initially formed, after planarization, layer 90 has a thickness 91A over S/D regions 74 and a thickness 91B over gate region 76, or where a metal gate electrode 45 is employed, directly over gate electrode 45 (not shown). As depicted, thickness 91B is less than thickness 91A.

While the specific thickness for each layer, depends upon the specific material selected and the overall thickness of gate structure 50, typically a maximum total thickness 91 of approximately 600 to 1300 nm, after planarization, is employed. As depicted, maximum total thickness 91 is the sum of thickness 87 of layer 85 and a thickness 91A. Thus where thickness 91 is 600 nm, gate structure 50 is 300 nm and 100 nm of process buffering is desired, thickness 91B is 200 nm, after planarization.

As one of ordinary skill knows, the amount of registration buffering required is a function of both the photolithographic and etch processes employed to form contact holes 92 and 94 (see FIG. 7). Thus a first portion of the buffering requirement arises from the placement and definition of openings 102 and 104 formed in a masking layer 100 overlying substrate 10. Masking layer 100 is typically a photoresist material and its formation and patterning to define openings 102 and 104 is accomplished using any appropriate photolithographic process.

Referring now to FIG. 7, the structure of FIG. 6 is shown after dielectric layer 90 and etch-stop layer 85 are etched to form S/D contact openings 92 and gate contact opening 94. After etching, any portions of masking layer 100 (FIG. 6) that remain are removed. Contact openings 92 and 94 are typically formed using an anisotropic etch process for each layer 90 and 85, respectively, to best replicate the size and position of resist openings 102 and 104 (FIG. 6). For example, in some embodiments, a silicon oxide layer 90 disposed over a silicon nitride layer 85 is etched using a reactive ion etch (RIE) process employing a trifluoromethane ($CHF_3$) and oxygen ($O_2$) gas mixture. While such an RIE process is known to anisotropically etch both silicon nitride and oxide, process conditions, e.g. gas ratios, power levels, etc. can be modified to enhance the etch rate of either material over that of the other to greater than 2:1. Other removal processes, employing other appropriate anisotropic methods and materials, can also be used. Where, for example $C_4F_8$ or $C_2HF_5$ are added to the above trifluoromethane chemistry, selective removal rates for layers 90 and 85 of greater than 20:1 are obtained. Where layer 90 is a PECVD silicon oxide material and layer 85 is a PECVD silicon nitride material, a first $CHF_3/C_2HF_5/O_2$ plasma etch process can be used to etch oxide layer 90 with selectivity to nitride layer 85. Thus, despite layer 90 having a thickness 93A in contact opening 92 greater than that of thickness 93B in contact opening 94, an etch time sufficiently long to clear all of layer 90 in openings 102 is possible, as the presence of layer 85 in opening 104 prevents damage to underlying gate silicide region 76. Then, once layer 90 is removed, a second $CHF_3/O_2$ plasma etch process is used to etch nitride layer 85. Thus embodiments of the present invention advantageously utilize etch-stop layer 85 to complete formation of contact openings 92 and 94, essentially simultaneously. In addition, it will be noted that portions 87 of layer 85 remain adjacent sidewalls 52 and 54.

Figure 1A:
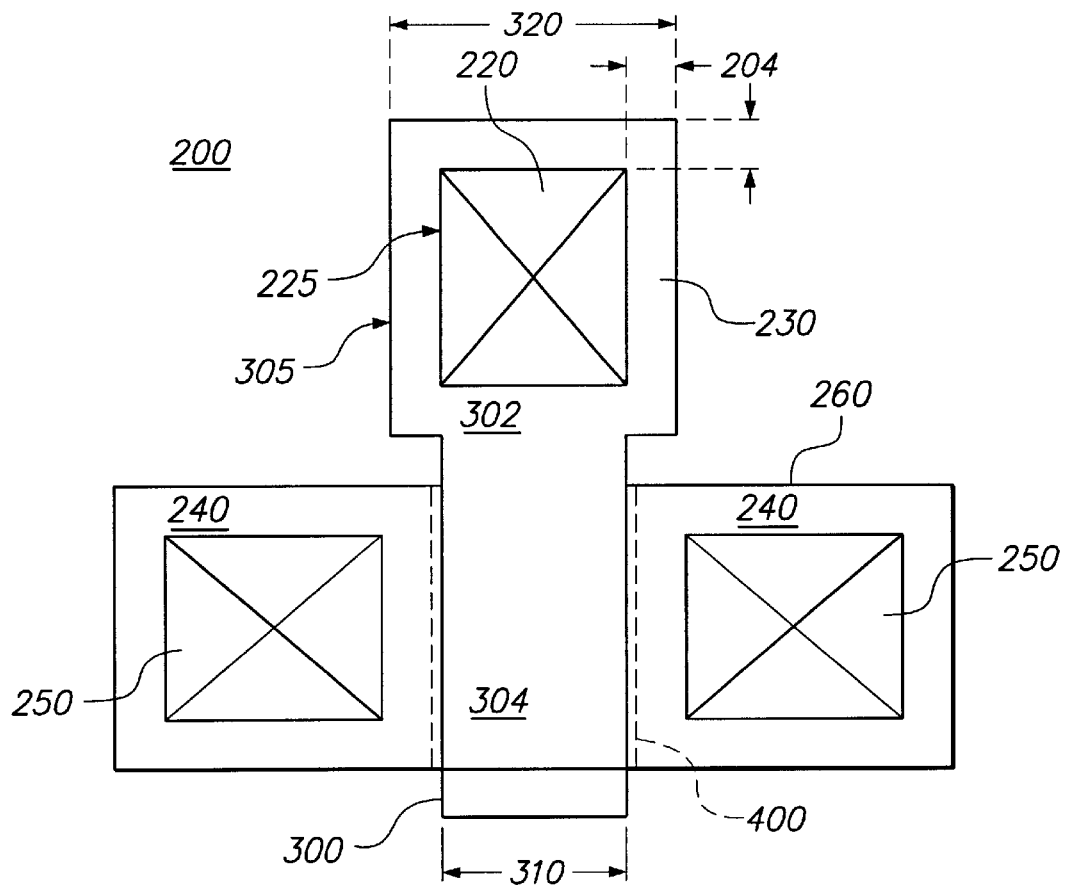
FIGS. 1A and 1B are plan views of transistors formed in the manner of the prior art.
Figure 1B:
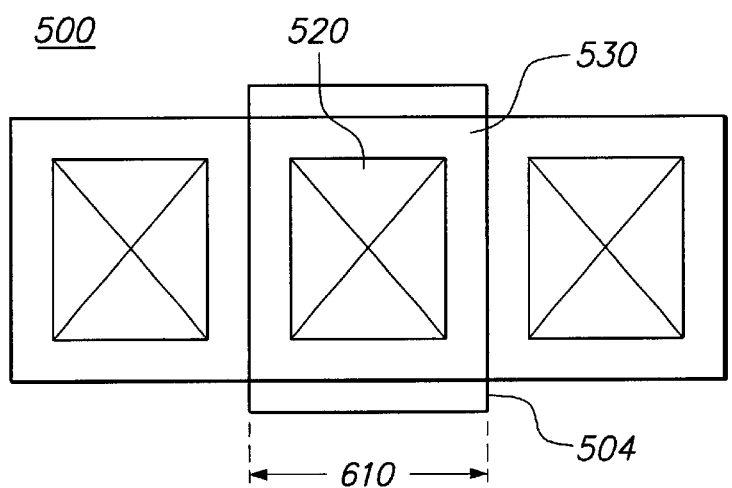

Still referring to FIG. 7, it will be noted that width 95 of gate contact opening 94 is essentially equal to dimension 77 of gate structure 50. As discussed previously with respect to FIG. 1A, prior art transistor 200 requires buffering regions 230 about contact hole 220. For transistor 200, buffering regions 230 could only be formed from portions of gate structure 300, hence regions 230 increased gate length 310. Embodiments of the present invention, however, provide an equivalent buffering function to that of regions 230 by and through portions 85A. As layer 85 is a dielectric material, portions 85A of layer 85 do not change the gate length (not shown) of transistors fabricated in accordance with these embodiments. Thus the gate length can be at the minimum dimension possible and maximum performance of the transistor obtained. In addition, as layer 85 is chosen to etch selectively with respect to isolation regions 30, little or no isolation oxide is lost from regions 30 when layer 85 is removed in S/D contact openings 92, where opening 92 overlaps portions of regions 74 and 30, as depicted. This then provides for process buffering of openings 92 in addition to the previously described buffering of opening 94. Hence, openings 92 can overlap isolation regions 30, adjacent S/D silicided contact regions 74, without subsequent electrical shorting due to deep oxide trenching within isolation regions 30 as often seen with prior art methods. Thus a transistor 150, having a direct gate contact opening 94 overlying a channel region 28, and method for forming, is enabled that provides for transistor 150 to have a minimum dimension for its gate length.

By now it will be realized that embodiments of the present invention have been described that provide a transistor, and method of fabrication, with silicide stringer removal and direct gate contacts with minimum gate dimensions. It will also be realized that the embodiments of the present invention described are compatible with standard MOS transistor processing employing gate structures having silicon gate layers or metal gate layers. Additionally, it will be realized that the embodiments described do not require additional masking steps to effect removal of silicide stringers or form the direct gate contacts. In addition, it will be realized that embodiments of the present invention have been described that are compatible with both trench isolation and LOCOS isolation methods, as well as a variety of semiconductor substrate types. Finally, it will be realized that embodiments of the present invention provide for transistors that require a minimum of wafer or substrate surface area, thus increasing device packing density.

We claim:

1. A method of forming a semiconductor device, comprising the steps of:

providing a gate electrode structure;

forming a sidewall spacer adjacent each opposite sidewall of said gate electrode structure, each spacer overlying a portion of a source region or a drain region proximate said gate electrode structure;

forming metal silicide regions;

subsequent to forming said metal silicide regions, etching said sidewall spacers to remove at least a portion of said sidewall spacers;

subsequent to etching said sidewall spacers, forming a conformal etch-stop layer overlying said semiconductor device;

forming a dielectric layer overlying said etch-stop layer;

etching a first portion of a first contact opening to at least a portion said gate electrode structure and second contact openings to at least a portion of each said silicide regions, wherein said dielectric layer is removed to expose said etch-stop layer; and etching a second portion of said first contact opening and said second contact openings, wherein said etch-stop layer is removed to expose said portions of said gate electrode structure and silicide region.

2. The method of claim 1 wherein providing a gate electrode structure comprises depositing a gate electrode layer selected from the group consisting of polysilicon, amorphous silicon, tungsten, tantalum, molybdenum and combinations thereof.

3. The method of claim 1 wherein forming metal silicide regions comprises forming source/drain silicide regions.

4. The method of claim 3 wherein forming metal silicide regions comprises forming a gate silicide region.

5. The method of claim 1 wherein forming a sidewall spacer adjacent each opposite sidewall of said gate electrode structure comprises forming said sidewall spacers of a material selected from the group consisting of silicon oxide, phosphorus doped silicon oxide and silicon nitride.

6. The method of claim 1 wherein forming a sidewall spacer adjacent each opposite sidewall of a gate electrode structure comprises forming said sidewall spacer having a first portion comprising silicon oxide and a second portion comprising silicon nitride.

7. The method of claim 1 wherein etching said sidewall spacers comprises etching-away essentially all of said sidewall spacers.

8. The method of claim 1 wherein forming metal silicide regions comprise depositing a metal layer selected from a group consisting of Co, Ti, W, Ta, Mo, Pt, Pd, Nd, Zr, Hf and Ni.

9. The method of claim 8 wherein depositing a metal layer comprises depositing a Co metal layer.

10. The method of claim 1 wherein forming a conformal etch-stop layer comprises depositing a layer comprising silicon nitride.

11. The method of claim 1 wherein forming a conformal etch-stop layer comprises forming a first layer comprising silicon oxide and a second layer, overlying said first layer, comprising silicon nitride.

12. The method of claim 1 wherein etching a first portion of a first contact opening comprises etching said first portion overlying a channel region of said semiconductor device and a portion of said etch-stop layer adjacent at least one sidewall of said gate electrode.

* * * * *

UNITED STATES PATENT AND TRADEMARK OFFICE
CERTIFICATE OF CORRECTION

PATENT NO. : 6,242,354 B1
DATED : June 5, 2001
INVENTOR(S) : Brian J. Daniels and Michael E. Thomas It is certified that error appears in the above-identified patent and that said Letters Patent is hereby corrected as shown below:

<u>Title page,</u>
Item [75], please add -- Brian J. Daniels -- as an inventor; and <u>Column 4,</u>
Line 59, please delete "titainium/titainium" and insert -- titanium/titanium --.

Signed and Sealed this

Twelfth Day of November, 2002

Attest:

JAMES E. ROGAN
*Attesting Officer*    *Director of the United States Patent and Trademark Office*